United States Patent [19]

Koike et al.

[11] Patent Number: 4,803,534
[45] Date of Patent: Feb. 7, 1989

[54] SEMICONDUCTOR DEVICE SRAM TO PREVENT OUT-DIFFUSION

[75] Inventors: Atsuyoshi Koike, Kokubunji; Shuji Ikeda, Koganei; Kouichi Nagasawa, Kunitachi, all of Japan

[73] Assignee: Hitachi, Ltd., Tokyo, Japan

[21] Appl. No.: 875,674

[22] Filed: Jun. 18, 1986

[30] Foreign Application Priority Data

Jun. 21, 1985 [JP] Japan .................... 60-134018

[51] Int. Cl.$^4$ .................................... H01L 23/48
[52] U.S. Cl. ........................... 357/71; 357/23.5; 357/45; 357/67
[58] Field of Search ............ 357/23.5, 59 I, 59 F, 357/59 J, 59 G, 45, 71, 71 S

[56] References Cited

U.S. PATENT DOCUMENTS

| | | | |
|---|---|---|---|
| 4,376,983 | 3/1983 | Tsaur et al. | 357/59 J X |
| 4,392,150 | 7/1983 | Covrreges | 357/71 S X |
| 4,488,166 | 12/1984 | Lehrer | 357/59 I X |
| 4,524,377 | 6/1985 | Eguchi | 357/59 J X |
| 4,536,941 | 8/1985 | Kuo et al. | 357/59 J X |
| 4,673,969 | 6/1987 | Ariizumi et al. | 357/59 J X |

*Primary Examiner*—Andrew J. James
*Assistant Examiner*—William A. Mintel
*Attorney, Agent, or Firm*—Antonelli, Terry & Wands

[57] ABSTRACT

A semiconductor device includes a first conductor layer into which is diffused an impurity for lowering the resistance, and a second conductor layer provided on the upper side of the first conductor layer through a stopper layer which suppresses out-diffusion of the impurity. By virtue of the existence of the stopper layer, it is possible to inhibit the above-described impurity from being diffused into the second conductor layer. In a SRAM, resistance variations between high-resistance elements which correspond to the second conductor layer can be suppressed, so that it is possible to prevent lowering of the yield with respect to the electrical reliability. In a SRAM, further, the resistance of the high-resistance elements is not lowered; therefore, it is possible to reduce the power consumption.

24 Claims, 8 Drawing Sheets

SEMICONDUCTOR DEVICE SRAM TO PREVENT OUT-DIFFUSION

BACKGROUND OF THE INVENTION

The present invention relates to a semiconductor device and a process for producing the same. More particularly, the present invention pertains to a technique which may be effectively employed in a semiconductor device having a conductor layer consisting of a polycrystalline silicon film and either a refractory metal film or a refractory metal silicide film.

There is a growing tendency for semiconductor devices having statis random-access memories (hereinafter referred to as "SRAMs") to have an increased packing density. To reduce the area occupied by memory cells in a SRAM, a high-resistance element in each flip-flop circuit is formed from a polycrystalline silicon film. For this purpose, so-called non-doped polycrystalline silicon, in which an impurity such as phosphorus for lowering the resistance is not diffused, is employed.

This high-resistance element is generally formed in a step of forming a second-level conductor layer. One end of the high-resistance element is connected to a supply voltage terminal (e.g., 5[V]) which holds the data "1", and the other end of the element is connected to the gate electrode of a driving MISFET connected to a reference voltage terminal (e.g., 0[V]) which holds the data "0". This gate electrode is generally formed in a step of forming a first-level conductor layer.

The present inventors have examined the abovedescribed conventional technique and have found that the following problems result from the formation of the gate electrode of a MISFET by a combination of a polycrystalline silicon film and a refractory metal silicide film superposed on the upper side of the silicon film for the purpose of increasing the operation speed.

The polycrystalline silicon film which defines the lower layer of the laminated film constituting the gate electrode has an impurity such as phosphorus or arsenic diffused therein for the purpose of lowering the resistance. In a step of forming a polycrystalline silicon film having no impurity doped therein and constituting a high-resistance element, the above-described impurity is diffused into the non-doped polycrystalline silicon film. More specifically, the refractory metal silicide film has a larger diffusion coefficient and a larger outward diffusivity than those of the polycrystalline silicon film. Therefore, such impurity-drawing up effect of the refractory metal silicide or other similar effect causes the impurity in the lower-layer polycrystalline silicon film to be diffused into the refractory metal silicide film, and this causes outdiffusion of the impurity which has been diffused in the silicide film, this impurity then being autodoped into the polycrystalline silicon film which defines the upper layer. In consequence, variations in resistance are produced between high-resistance elements, and this lowers the yield with respect to the electrical reliability of SRAM. The experiment carried out by the present inventors has confirmed that resistance variations between high-resistance elements lead to an increase in the standby current and, moreover, cause it to vary in a range from 100[$\mu$A] to 1[m$\mu$]. Thus, the above-described conventional technique involves the disadvantage that the electrical characteristics of SRAMs are deteriorated, thus resulting in a defective product.

In addition, the diffusion of an impurity undesirably lowers the resistance of the high-resistance elements, and this leads to an increase in the power consumption of SRAMs.

It should be noted that information concerning SRAMs is contained in "Very Large Scale Integrated Circuit Device Handbook", K.K. SCIENCE FORUM, Nov. 28, 1983, p. 305 to p. 313.

SUMMARY OF THE INVENTION

It is an object of the present invention to provide a technique by which an impurity that is diffused in a conductor layer in a semiconductor device for the purpose of lowering the resistance of the conductor layer can be inhibited from being diffused into other different conductor layers.

It is another object of the present invention to provide a technique which enables suppression of resistance variations between high-resistance elements in SRAMs and thereby prevents lowering of the yield with respect to the electrical reliability.

It is still another object of the present invention to provide a technique which enables reduction in the power consumption in SRAMs.

The following is a brief description of a representative of the novel techniques disclosed in the present application.

Namely, a second conductor layer is provided on the upper side of a first conductor layer in which an impurity has been diffused in order to lower the resistance, through a stopper layer which suppresses the out-diffusion of the impurity in the first conductor layer.

By virtue of this arrangment, the above-described impurity can be inhibited from being diffused and added into the second conductor layer. More specifically, in SRAMs, it is possible to suppress resistance variations between high-resistance elements and thereby prevent the lowering of the yield with respect to the electrical reliability. In SRAMs, since there are no resistance variations between highresistance elements and the resistance is not lowered by the auto-dope of the diffused impurity as in the case of the prior art, no leakage current flows, and the power consumption can be reduced by an amount corresponding to the leakage current which would otherwise flow.

BRIEF DESCRIPTION OF THE DRAWINGS

The aforementioned and other objects and novel features of the present invention will become apparent from the following description taken with reference to the accompanying drawings, in which.

DESCRIPTION OF THE PREFERRED EMBODIMENTS

Figure 1:
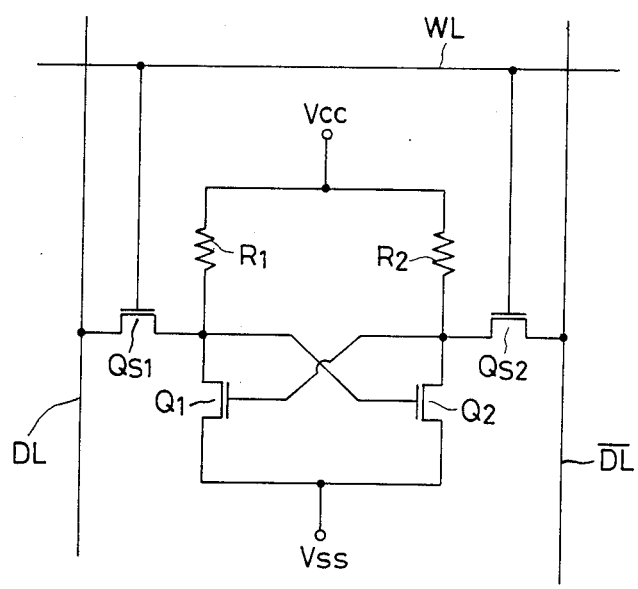
FIG. 1 is a diagram showing an equivalent circuit of a memory cell in a SRAM in accordance with one embodiment of the present invention.

The arrangement of the present invention will be described hereinder by way of one embodiment in which the present invention is applied to SRAMs.

It should be noted that members or portions having the same functions are denoted by the same reference numerals throughout the drawings showing the embodiment, and repetitive description thereof is omitted.

A memory cell for a SRAM in accordance with one embodiment of the present invention is shown by way of an equivalent circuit illustrated in FIG. 1.

In FIG. 1, reference symbols DL, $\overline{DL}$ denote a pair of data lines extending in the row direction, and WL represents a word line which extends in the column direction.

A SRAM has a plurality of memory cells each provided at the intersection between a pair of data lines DL, $\overline{DL}$ and a word line WL. Each memory cell is composed of a flip-flop circuit which consists of highresistance elements $R_1$, $R_2$, and driving n-channel MISFETs $Q_1$, $Q_2$ and which has a pair of input/output terminals, and transfer n-channel MISFETs $Q_{s1}$, $Q_{s2}$ which connect the pair of input/output terminals and the data lines DL, $\overline{DL}$, respectively.

The reference symbol $V_{cc}$ denotes a terminal or a supply voltage (the operating voltage of the circuit, e.g., 5[V]) which holds the data logic "1" level, and $V_{ss}$ denotes a terminal for a reference voltage (the ground voltage of the circuit, e.g., 0[V]) which holds the data logic "0" level.

Figure 2:
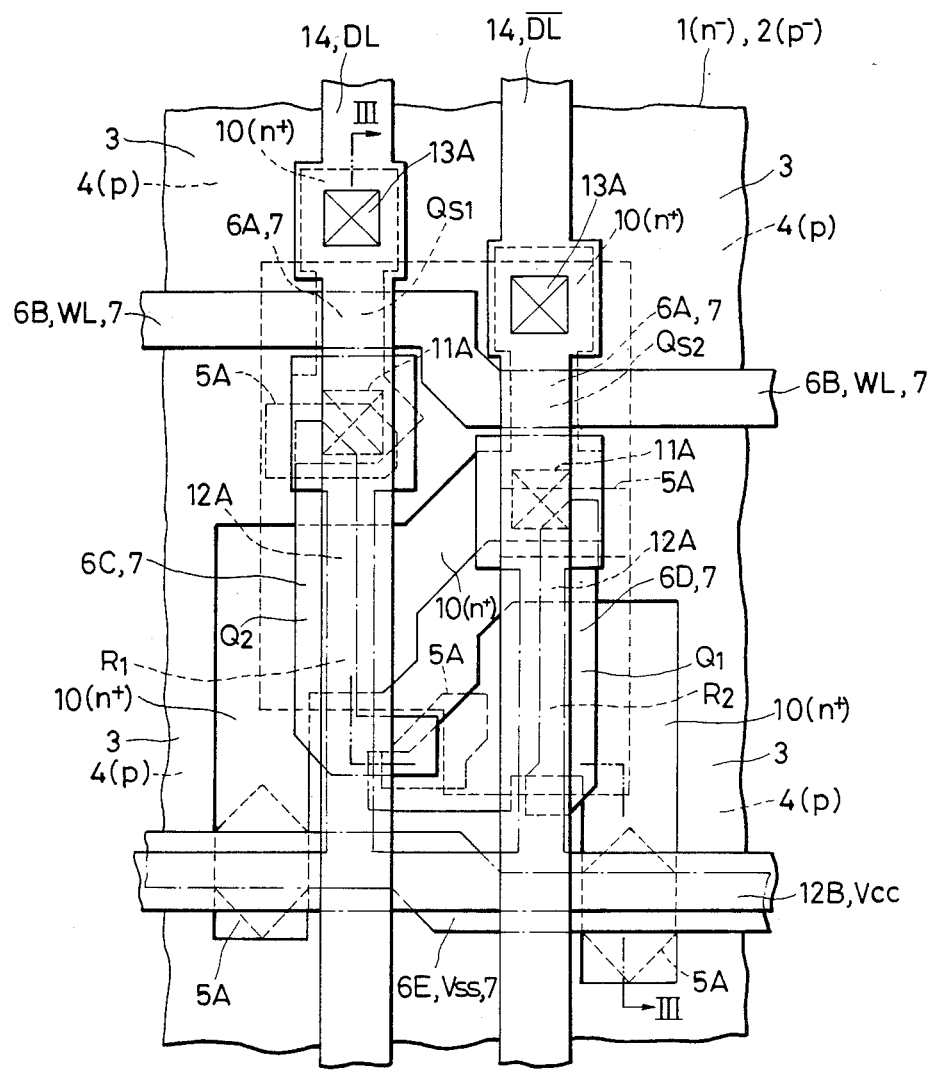
FIG. 2 is a plan view showing a practical structure of a memory cell in a SRAM in accordance with one embodiment of the present invention.
Figure 3:
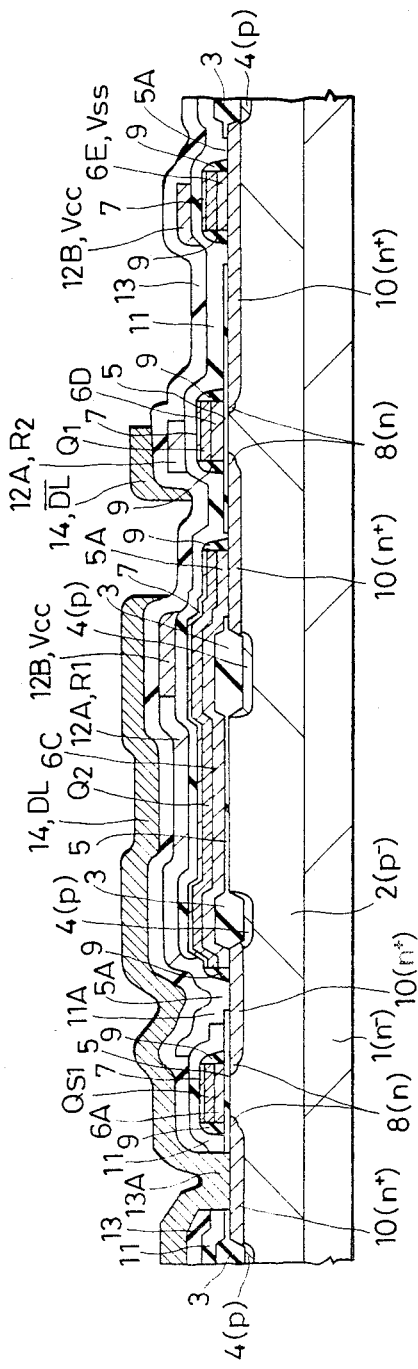
FIG. 3 is a sectional view taken along the line III—III in FIG. 2.

FIG. 2 is a plan view of a practical structure of the memory cell thus arranged, and FIG. 3 is a sectional view taken along the line III—III in FIG. 2. It should be noted that any insulating film other than a field insulating film provided between conductor layers is not shown in the plan view of FIG. 2 for the purpose of facilitating understanding of the arrangement of this embodiment.

In FIGS. 2 and 3: the reference numeral 1 denotes an $n^-$-type semiconductor substrate of single crystal silicon; 2, a $p^-$-type well region; 3, a field insulating film; 4, p-type channel stopper regions; 5, a gate insulator film for MISFETs; and 5A contact holes for direct contact provided by selectively removing the gate insulator film 5.

Conductor layers 6A to 6E are provided in such a manner as to be disposed on the upper side of the field insulator film 3 or the gate insulator film 5, or connected to predetermined well regions ($n^+$-type semicondcutor regions are formed in these portions) through the contact holes 5A, respectively.

The conductor layer 6A constitutes the respective gate electrodes of the transfer MISFETs $Q_{s1}$, $Q_{s2}$. The conductor layer 6B constitutes word lines WL. The conductor layers 6C, 6D respectively constitute the driving MISFETS hd 1, $Q_2$. The conductor layer 6E constitutes a wiring for the reference voltage $V_{ss}$.

Each of the conductor layers 6A to 6E is constituted by a laminated film composed of a polycrystalline silicon film in which an n-type impurity such as phosphorus or arsenic has been diffused in order to lower the resistance and a molybdenum silicide ($MoSi_2$) film provided on the upper side of the silicon film, that is, a polycide film (a film in which a refractory metal silicide film is laminated on the surface of a polycrystalline silicon film). The conductor layers 6A to 6E may be constituted by polycide films other than the above-mentioned, i.e., $TaSi_2$/poly-Si, $TiSi_2$/poly-Si or $WSi_2$/poly-Si. Further, the conductor layers 6A to 6E may be constituted by a laminated film in which a refractory metal, i.e., Mo, Ta, Ti or W is provided on the upper side of a polycrystalline silicon film.

The conductor layers 6A to 6E are formed in a step of forming a first-level conductor layer in the production process.

A stopper layer 7 is provided on the upper side of the molybdenum silicide film which constitutes a part of the conductor layers 6A to 6E. The stopper layer 7 is formed so that an impurity such as phosphorus or arsenic which has been diffused in the polycrystalline silicon film of the conductor layers 6A to 6E is not diffused into a polycrystalline silicon film which is in a non-impurity doped state and which constitutes a high-resistance element (described later) under a heat treatment during the formation of this polycrystalline silicon film. This stopper layer 7 may be provided at least on the surface of the refractory metal film or the refractory metal silicide film which is exposed through the contact holes. This is done in order that the impurity diffused in the refractory metal film or the refractory metal silicide film is inhibited by the stopper layer 7 from being out-diffused through the contact hole portions. The surface of the other portion of the refractory metal film or the refractory metal silicide film is coated with the insulating film 11 which performs the same function as that of the stopper layer 7 and which is therefore effective in suppressing the out-diffusion of the diffused impurity.

The stopper layer 7 is provided so as to prevent the out-diffusion of the diffused impurity from a conductor layer which is constituted by a polycrystalline silicon film having an impurity diffused therein and either a refractory metal film or a refractory metal silicide film laminated thereon. Such a conductor layer has the problem that a large amount of diffused impurity is particularly out-diffused from the refractory metal film or the refractory metal silicide film laminated on the polycrystalline silicon film. The reason for this will be explained below.

The refractory metal film or the refractory metal silicide film has a larger coefficient of diffusion of the diffused impurity than that of the polycrystalline silicon film and is also larger than the latter in terms of the amount of out-diffusion of the diffused impurity.

Accordingly, the impurity which has been diffused and added into the polycrystalline silicon film is moved (diffused) into the refractory metal film or the refractory metal silicide film during various heat treatments. As a consequence, a large amount of an impurity which has been contained in the polycrystalline silicon film is now contained in the refractory metal film or the refractory metal silicide film.

This is attributable to the fact that the coefficient of diffusion of the diffused impurity is larger in the refractory metal film or the refractory metal silicide film than in the polycrystalline silicon film.

In addition, the degree of out-diffusion of the diffused impurity in the refractory metal film or the refractory metal silicide film is higher than in the polycrystalline silicon film. Accordingly, the amount of the diffused impurity which is out-diffused from the conductor layer constituted by a polycrystalline silicon film and a refractory metal film or a refractory metal silicide film laminated thereon is exceedingly larger than that from the polycrystalline silicon film.

For this reason, the material for the stopper layer should have a smaller coefficient of diffusion of the diffused impurity (P, As, B, etc.) than that of the refractory metal or refractory metal silicide employed and, moreover, it should be lower than the latter in terms of the degree of out-diffused of the diffused impurity. At least, the material for the stopper layer should be lower than the refractory metal or refractory metal silicide employed in terms of the degree of out-diffusion of the diffused impurity.

As will be clear from the above, the stopper layer serves to suppress the out-diffusion of the diffused impurity from the refractory metal film or the refractory metal silicide film. Therefore, it suffices to employ as a material for the stopper layer one which allows a smaller amount of out-diffusion of the diffused impurity than the amount of the difused impurity which is out-diffused from the refractory metal or refractory metal silicide employed.

More practically, the stopper layer 7 is constituted by a conductor layer formed from a polycrystalline silicon film or a single crystal silicon film and has a film thickness of about 300 to 700 [Å].

The stopper layer 8 serves not only to suppress the out-diffusion of the impurity from the ground conductor layer but also to improve the adhesion between the ground conductor layer and an intermediate insulator film formed thereon. More specifically, the adhesion between a refractory metal film or a refractory metal silicide film and an intermediate insulator film, e.g., a silicate glass film such as a PSG (Phospho Silicate Glass) film or a BSG (Boro Silicate Glass) film, or an $SiO_2$ film, is not good, so that separation may occur therebetween. In the present invention, however, the stopper layer made of an electrically conductive material, such as a polycrystalline silicon film or a single crystal silicon film, is provided on the surface of the refractory metal film or the refractory metal silicide film. Therefore, the adhesion between this stopper layer and the refractory metal film or the refractory metal silicide film is good. In addition, since the adhesion between the stopper layer and the intermediate insulator film is good, the interposition of the stopper layer between the above-described conductor layer and the intermediate insulator film provides good adhesion between the adjacent films in such structure. Accordingly, the stopper layer contributes to the prevention of separation of the adjacent films.

Further, when the refractory metal film or the refractory metal silicide film and an upper-level wiring conductor layer are connected together, the conductivity in the connection region is improved by virtue of the existence of the stopper layer. This is because the stopper layer functions as a protection film for protecting the surface of the refractory metal film or the refractory metal silicide film, so that the surface of the refractory metal film or the refractory metal silicide film is protected by the stopper layer from oxidation or damage during the steps in the production process carried out before the refractory metal film or the refractory metal silicide film is connected to the upper-level wiring conductor layer.

The above-described production process includes photoetching, CVD, sputtering and a step of storage and transportation in which the refractory metal film or the refractory metal silicide film may be exposed to the outside air, and this involves the fear of the surface of the refractory metal film or the refractory metal silicide film being oxidized or damaged to increase the surface resistance.

The reference numeral 8 denotes n-type semiconductor regions provided in the main surface portion of the well region 2 and on both sides of each of the conductor layers 6A, 6C and 6D, and the numeral 9 denotes side walls made of an insulator such as $SiO_2$ and provided on both sides of each of the conductor layers 6A to 6E, the side walls 9 also serving as a mask used when an impurity is introduced.

The numeral 10 denotes $n^+$-type semiconductor regions which are provided in the main surface portion of the well region 2 and on both sides of each of the conductor layers 6A, 6C and 6D.

Each of the transfer MISFETs $Q_{s1}$, $Q_{s2}$ is mainly composed of the well region 2, the gate insulator film 5, the conductor layer 6A and a pair of semiconductor regions 8, 10 which constitute source or drain regions.

Each of the driving MISFETs $Q_1$, $Q_2$ is mainly composed of the well region 2, the gate insulator film 5, the conductor layer 6D or 6C and a pair of semiconductor regions 8, 10 which constitute source or drain regions.

These MISFETs $Q_{s1}$, $Q_{s1}$, $Q_1$ and $Q_2$ have the LDD (Lightly Doped Drain) structure.

The numeral 11 denotes an insulator film which covers the semiconductor elements, that is, which is provided on the upper side of the conductor layers 6A to 6E, and the numeral 11A denotes connection holes (contact holes) provided by removing the insulator films 5, 11 above the semiconductor regions 10 and the insulator film 11 above the conductor layers 6C and 6D.

Conductor layers 12A, 12B are provided on the upper side of the insulator film 11. One end of the conductor layer 12A is connected to the semiconductor region 10 through the connection hole 11A and connected to the conductor layers 6C, 6D through the contact hole 11A and the stopper layer 7. The other end of the conductor layer 12A is connected integral with the conductor layer 12B. The conductor layer 12A is adapted to consitute high-resistance elements $R_1$, $R_2$. The conductor layer 12B is adapted to constitute a wiring for the supply voltage $V_{cc}$.

The conductor layers 12A, 12B are formed in a second-level conductor layer forming step in the production process. The conductor layers 12A is formed from a non-doped polycrystalline silicon film, while the conductor layer 12B is formed by diffusing an impurity into a non-doped polycrystalline silicon film so as to lower the resistance thereof.

The reference numeral 13 denotes an insulator film covering the conductor layers 12A, 12B, and the numeral 13A denotes contact holes provided by removing the insulator films 5, 11 and 13 above given semiconductor regions 10.

A conductor layer 14 is provided on the upper side of the insulator film 13 and electrically connected to given semiconductor regions 10 through the contact holes 13A, thereby constituting data lines DL. The conductor layer 14 is formed in a third-level conductor layer forming step in the production process and is made from, for example, aluminium (Al) film.

The following is a description of a practical process for producing this embodiment.

Figure 4:
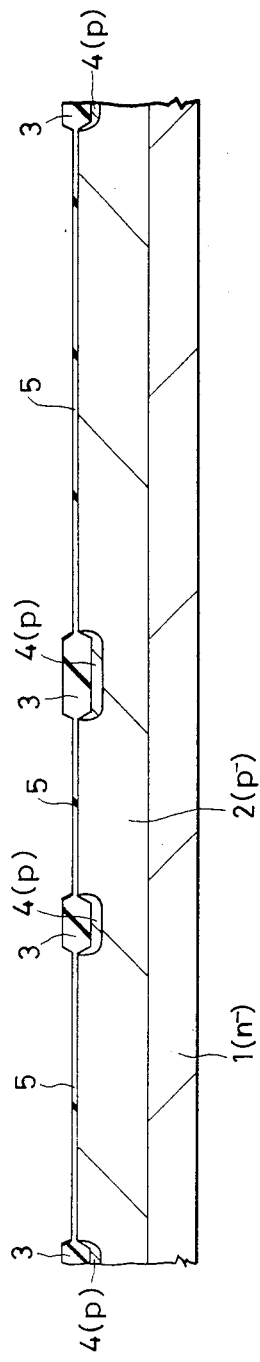
FIGS. 4 to 9 are sectional views showing a memory cell in a SRAM in accordance with one embodiment of the present invention in sequential steps in the process for producing the same.
Figure 5:
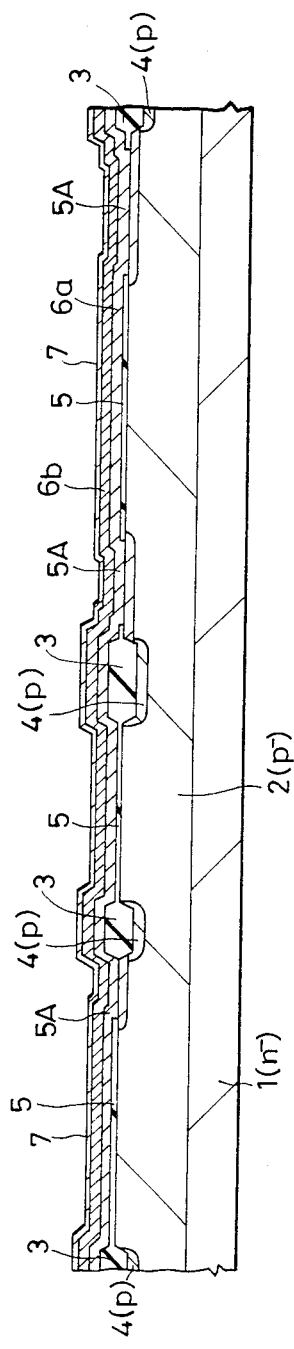
Figure 6:
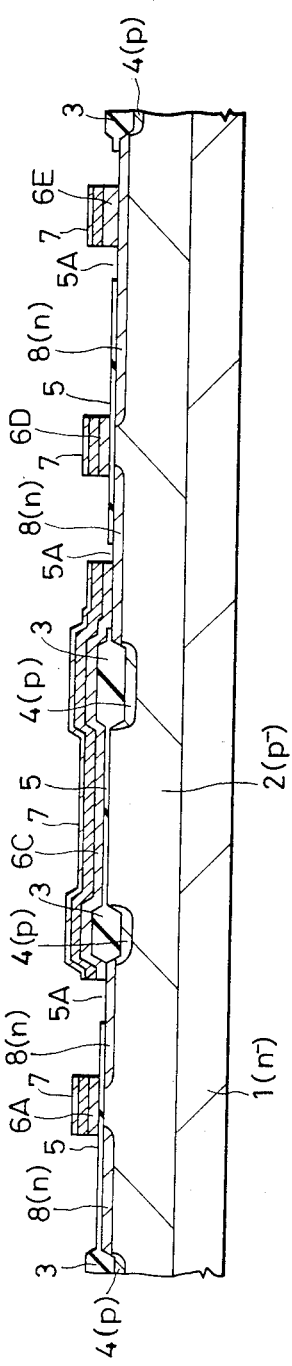
Figure 7:
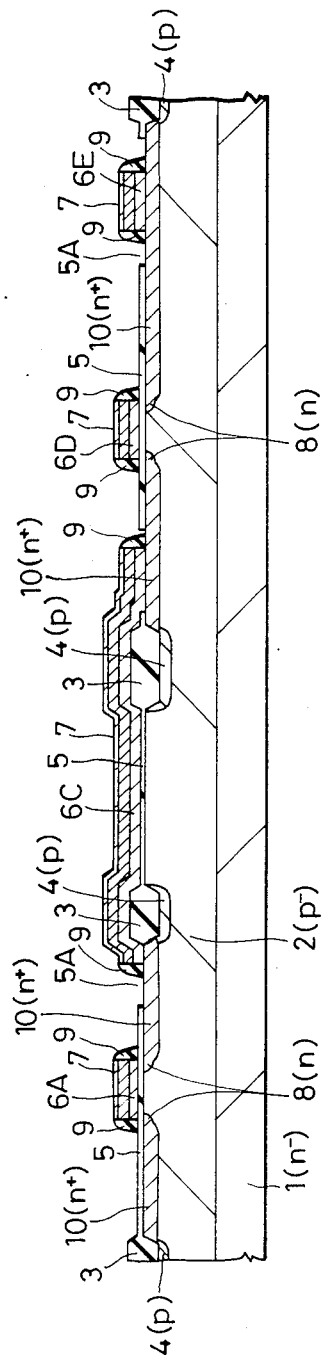
Figure 8:
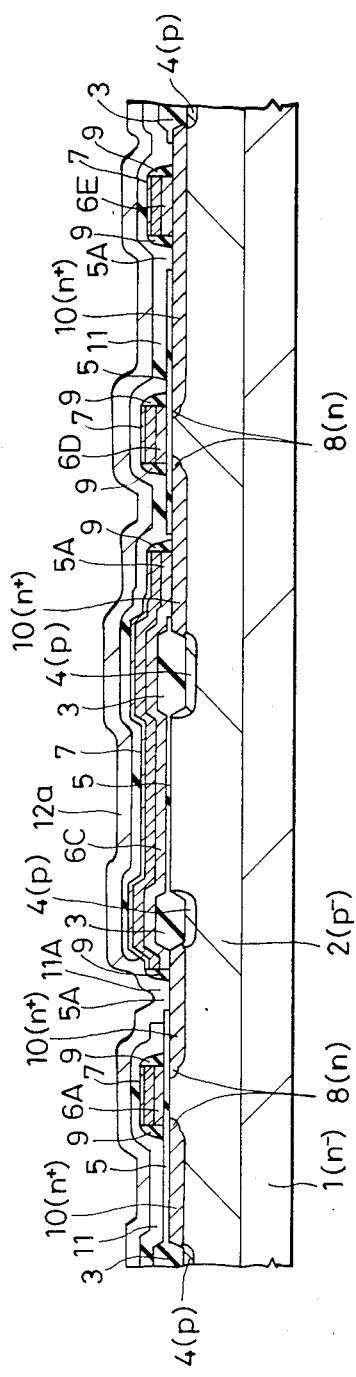
Figure 9:
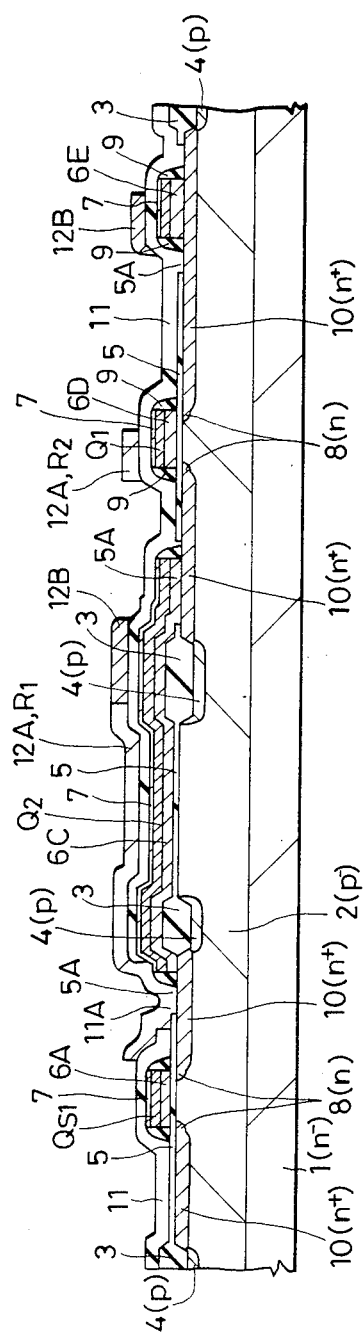
Figure 10:
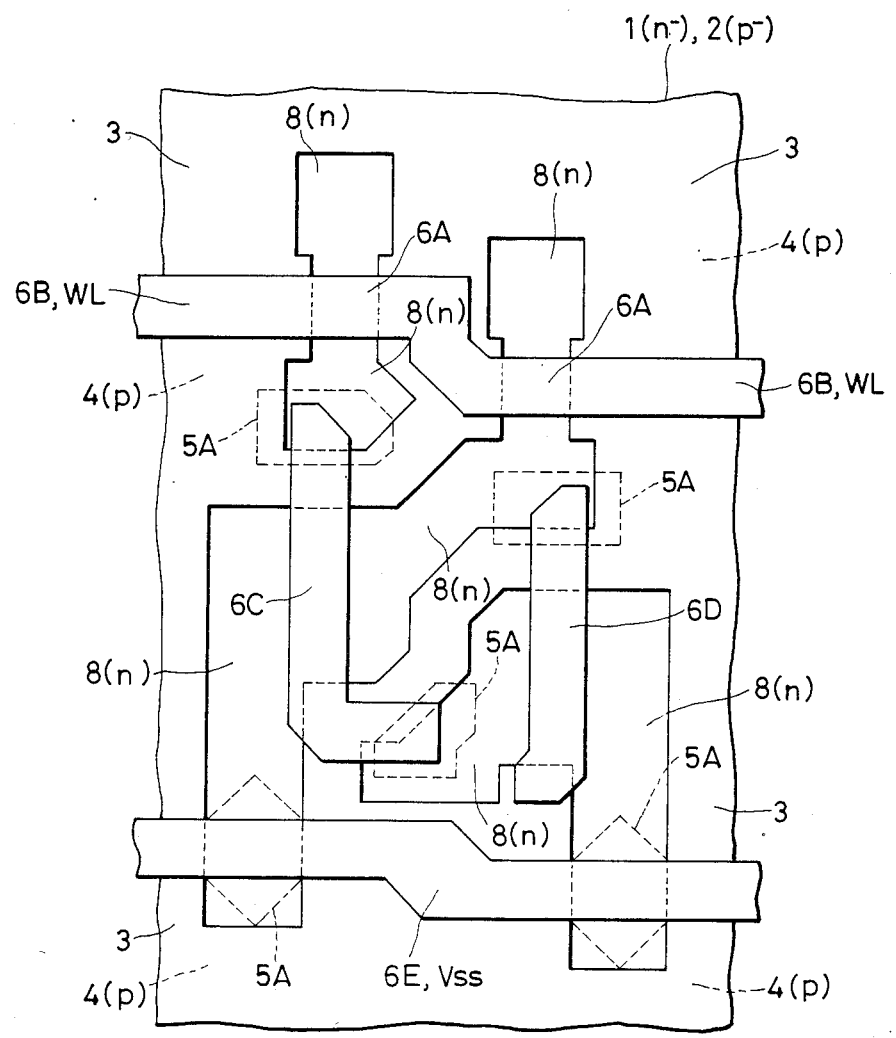
FIG. 10 is a plan view of the memory cell shown in FIG. 6.
Figure 11:
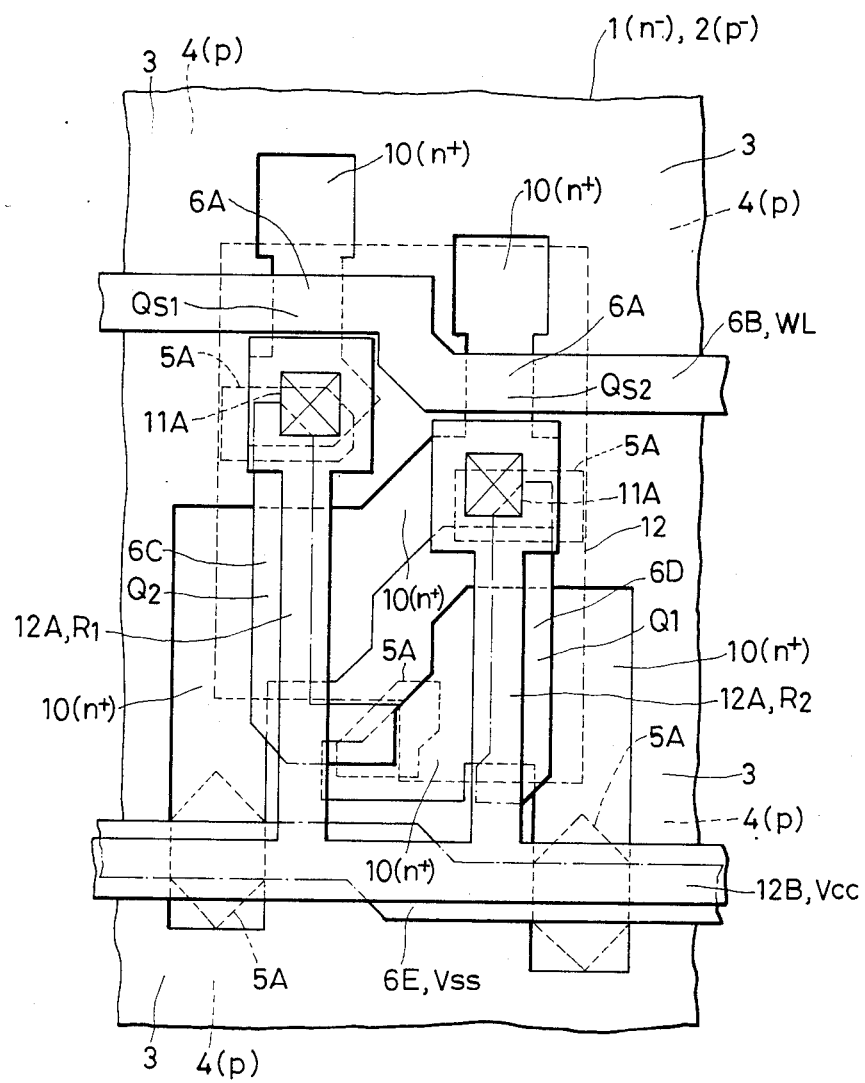
FIG. 11 is a plan view of the memory cell shown in FIG. 9.

FIGS. 4 to 9 are sectional views of a memory cell in SRAM in accordance with one embodiment of the present invention in sequential steps, respectively, in the production process, while FIG. 10 is a plan view of the memory cell in the step shown in FIG. 6, and FIG. 11 is a plan view of the memory cell in the step shown in FIG. 9.

First, a p⁻-type well region 2 is formed in an n⁻-type semiconductor substrate 1. A field insulator film 3 is formed on the upper main surface of the well region 2, and p-type channel stopper regions 4 are formed in the main surface portion of the well region 2.

As shown in FIG. 4, a gate insulator film 5 is formed on the upper main surface of the well region 2 so that the film 5 covers the regions forming the semiconductor elements.

After the step of forming the insulator film 5 shown in FIG. 4, portions of the insulator film 5 which respectively cover regions forming the direct contacts are removed so as to form contact holes 5A.

Thereafter, a polycrystalline silicon film 6a in which is diffused an impurity such as phosphorus or arsenic for lowering the resistance and a molybdenum silicide film 6b are successively laminated to form a first-level conductor layer. The impurity contained in the polycrystalline silicon film 6a is diffused into main surface portions of the well region 2 which are connected to the polycrystalline silicon film 6a through the respective contact hole 5A, thereby forming n⁺-type semiconductor regions (no reference numerals are given).

Thereafer, a stopper layer 7 is formed on the upper side of the molybdenum silicide film 6b as shown in FIG. 5. The stopper layer 7 is constituted by a non-doped polycrystalline silicon film formed by, for example, sputtering or CVD (Chemical Vapor Deposition), the film having a thickness of about 300 to 700 [Å].

The stopper layer 7 is preferably formed in such a manner that, after the molybdenum silicide film 6b has been formed using a CVD apparatus, a polycrystalline silicon film or a single crystal silicon film is continuously formed by changing reaction gas conditions and thermal conditions. More specifically, after the molybdenum silicide film 6b has been formed, the stopper layer 7 is continuously formed without removing the sample and without exposing the sample to the outside air.

In this case, a photo-induced CVD apparatus or a sputtering apparatus may also be used.

The formation of the molybdenum silicide film 6b and the stopper layer 7 in the same apparatus enables the molybdenum silicide film 6b to be formed without the fear of the surface of the film 6b being oxidized by the outside air and without the risk of the surface characteristics of the film 6b being deteriorated. The molybdenum silicide film 6b is necessarily limitative, and a refractory metal film or a refractory metal silicide film may be formed by the above-described method.

Since the stopper layer 7 is provided on the whole surface of the molybdenum silicide film 6b as described above, it is possible to suppress the outdiffusion of the impurity contained (diffused) in the polycrystalline silicon film 6a by the drawingup action of the molybdenum silicide film 6b. Thus, it is possible to inhibit the lowering in the amount of impurity diffused in the polycrystalline silicon film 6a, and as such there is therefore no fear of the resistance of the film 6a being changed. In other words, since the out-diffusion of the impurity can be suppressed in contrast to the prior art, it is possible, in the present invention, to lower the resistance of the polycrystalline silicon film 6a to a larger extent than that in the case of the prior art.

After the formation of the stopper layer 7 shown in FIG. 5, the stopper layer 7, the molybdenum silicide film 6b and the polycrystalline silicon film 6a are subjected to patterning in order to form gate electrodes, word lines WL and a wiring for a reference voltage $V_{ss}$. This patterning is effected by an anisotropic ecthing such as RIE (Reactive Ion Etching).

Then, n-type semiconductor regions 8 are respectively formed on both sides of each of the conductor layers 6A, 6C, 6D and 6E as shown in FIGS. 6 to 10. The semiconductor regions 8 are formed in such a manner that a predetermined impurity is introduced into main surface portions of the well region 2 by ion implantation and subjected to a heat treatment for extended diffusion.

After the formation of the semiconductor regions 8 shown in FIGS. 6 and 10, side walls 9 made of an insulator such as $SiO_2$ are respectively formed on both sides of each of the conductor layers 6A to 6E. This also means the formation of a mask 9 for introducing an impurity used for forming semiconductor elements having an LDD structure.

Thereafter, with this maks 9 employed, n⁺-type semiconductor regions 10 of an LDD structure which are used as source or drain regions are respectively formed in main surface portion of the well region 2 as shown in FIG. 7. The semiconductor regions 10 may be formed by ion implantation in a manner similar to that in the case of the semiconductor regions 8.

After the step of forming the semiconductor regions 10 shown in FIG. 7, an insulator film 11 is formed on the whole surface, and predetermined portions of the insulator film 11 are removed to form contact holes 11A.

Thereafter, as shown in FIG. 8, a non-doped polycrystalline film 12a is formed in such a manner that the film 12a is connected to the semiconductor regions 10 through the contact holes 11A and also to the conductor layers 6C, 6D through the stopper layer 7. This polycrystalline silicon film 12a is provided for forming high-resistance elements $R_1$, $R_2$ and a wiring for a supply voltage $V_{cc}$.

Since the stopper layer 7 is provided on the upper side of the conductor layers 6C, 6D at least at the contact holes 11A as described above, it is possible to suppress the out-diffusion of the impurity diffused in the polycrystalline silicon film constituting the conductor layers 6C, 6D during the step of forming the polycrystalline silicon film 12a. More specifically, there is no fear of the above-described impurity being auto-doped into, particularly, the regions for forming the high-resistance elements $R_1$, $R_2$. Thus, it is possible to suppress resistance variations between the high-resistance elements $R_1$, $R_2$ and prevent the lowering of the yield with respect to the electrical reliability. Results of the experiment carried out by the present inventors have confirmed that it is possible to reduce the standby current to an extremely small value and hold it within a variation range from about 2 to 5 [μA] by virtue of the effective suppression of resistance variations of the highresistance elements $R_1$, $R_2$. In addition, since the auto-doped of the impurity is inhibited, the resistance of the high-resistance elements $R_1$, $R_2$ does not change and is not lowered. Therefore, there is no fear of any leakage current flowing when the semiconductor device is in an operative or inoperative state, so that it is possible to reduce the power consumption by an amount corresponding to the leakage current which would otherwise flow.

After the formation of the polycrystalline silicon film 12a shown in FIG. 8, an impurity for lowering the resistance is diffused into the polycrystalline silicon film 12a in the region for forming the wiring for the supply voltage $V_{cc}$.

Then, as shown in FIGS. 9 and 11, the polycrystalline silicon film 12a is subjected to patterning to form conductor layers 12A defining the high-resistance elements $R_1$, $R_2$ and a conductor layer 12B defining the wiring for the supply voltage $V_{cc}$.

It should be noted that an impurity which is diffused into the polycrystalline silicon film 12a is introduced into a portion other than the region surrounded by the dotted line indicated by the reference numeral 12 in FIG. 11.

After the step shown in FIGS. 9 and 11, an insulator film 13 which covers the whole surface is formed. Then, contact holes 13A are formed, and a conductor layer 14 for constituting data lines DL is formed.

Through the above-described series of production steps, a semiconductor device including a memory cell for SRAM shown in FIGS. 2 and 3 is completed.

It should be noted that, although the LDD structure is adopted for the MISFETs Q, $Q_s$ in this embodiment, the present invention is not necessarily limited to this, and MISFETs having an ordinary structure may be employed.

As has been described above, the novel technique disclosed in this application provides the following advantages.

(1) A stopper layer is provided on the upper side of a first conductor layer into which is diffused an impurity for lowering the resistance, the stopper layer being adapted to suppress the out-diffusion of the impurity, and a second conductor layer is provided so as to be connected to the first conductor layer through the stopper layer. It is therefore possible to inhibit the impurity from being diffused into the second conductor layer.

(2) The fact mentioned in (1) prevents the lowering of as well as variations in the resistance of highresistance elements in SRAMs, and it is therefore possible to prevent the lowering of the yield with respect to the electrical reliability. (3) Since the fact mentioned in (1) prevents the resistance of high-resistance elements in SRAMs from being changed as well as lowered, there is no fear of any leakage current flowing when the semiconductor device is in an operative or inoperative state. Accordingly, the power consumption can be reduced by an amount corresponding to the leakage current which would otherwise flow.

Although the invention accomplished by the present inventors has been described by way of the practical and exemplary embodiment above, it is a matter of course that the present invention is not necessarily limited to the above-described embodiment, and various changes and modifications may be imparted thereto without departing from the spirit and scope of the invention.

What is claimed is:

1. A semiconductor device comprising:
   a first conductor layer comprised of one of a refractory metal film and a refractory metal silicide film provided on an upper side of a polycrystalline silicon film into which is diffused an impurity for lowering the resistance thereat;
   a stopper layer provided on the upper side of said first conductor layer and being disposed over and having the same pattern shape as said first conductor layer;
   an insulator film formed overlying said first conductor layer and said stopper layer;
   a contact hole formed through a portion of said insulator film above said first conductor layer; and
   a second conductor layer comprised of a polycrystalline silicon film provided on the upper side of said insulator film and electrically connected to said first conductor layer through said contact hole and said stopper layer; said stopper layer being such that is inhibits the impurity contained in said first conductor layer from being diffused into said second conductor layer.

2. A semiconductor device according to claim 1, wherein said stopper layer is a conductor layer having a smaller coefficient of diffusion of a diffused impurity than the coefficient of diffusion of a diffused impurity in said refractory metal film or refractory metal silicide film.

3. A semiconductor device according to claim 1, wherein said stopper layer is a polycrystalline film.

4. A semiconductor device according to claim 1, wherein said stopper layer is a single crystal silicon film.

5. A semiconductor device according to claim 1, wherein said first conductor layer comprises a gate electrode of a MISFET.

6. A semiconductor device according to claim 1, wherein said second conductor layer is comprised of a non-doped polycrystalline silicon film portion wherein a diffused impurity is added for forming a wiring and a non-doped polycrystalline silicon film portion for forming a resistant element having a relatively higher resistance than the second conductor layer wiring, said silicon film portions being electrically connected to each other.

7. A semiconductor device according to claim 1, wherein said first conductor layer is comprised of a polycide film.

8. A semiconductor device according to claim 1, wherein said refractory metal film is made from one element selected from among molybdenum (Mo), tantalum (Ta), titanium (Ti) and tungsten (W).

9. A semiconductor device according to claim 1, wherein said refractory metal silicide film is made from a material selected from among molybdenum silicide ($MoSi_2$), tantalum silicide ($TaSi_2$), titanium silicide ($TiSi_2$) and tungsten silicide ($WSi_2$).

10. A semiconductor device according to claim 1, wherein said second conductor layer comprises a portion thereof which forms a resistance element in a memory cell of a SRAM.

11. A semiconductor device according to claim 1, wherein said refractory metal film and said refractory metal silicide film having a greater outward diffusivity characteristic than said stopper layer.

12. A semiconductor device according to claim 11, wherein said stopper layer is comprised of electrically conductive material provided on an upper surface of said refractory metal or metal silicide film.

13. A semiconductor device according to claim 12, wherein said electrically conductive material incudes one of a polycrystalline silicon film and single crystal silicon film.

14. A semiconductor device according to claim 13, wherein said stopper layer has a thickness of about 300 Å to 700 Å.

15. A semiconductor device comprising:
    a first conductor layer comprised of one of a refractory metal film and a refractory metal silicide film provided on an upper side of a polycrystalline silicon film into which is diffused an impurity for lowering the resistance thereat;

a stopper layer provided on the upper side of said first conductor layer and being disposed over and having the same pattern shape as said first conductor layer;

an insulator film overlying said first conductor layer and said stopper layer; and a second conductor layer provided on the upper side of said insulator film and including a predetermined portion thereof provided as a resistance element constituted by a polycrystalline silicon film; wherein said stopper layer is such that it inhibits the impurity contained in said first conductor layer from being diffused into said second conductor layer.

16. A semiconductor device according to claim 15, wherein said first conductor layer comprises a gate electrode of a MISFET.

17. A semiconductor device according to claim 15, wherein said second conductor layer predetermined portion thereof constitutes a resistance element of a memory cell in a SRAM.

18. A semiconductor device according to claim 15, wherein said stopper layer is a conductor layer having a smaller coefficient of diffusion of a diffused impurity than the coefficient of diffusion of a diffused impurity in said refractory metal or refractory metal silicide.

19. A semiconductor device according to claim 18, wherein said first gate layer comprises a gate electrode of a MISFET and said second conductor layer is provided for forming both film resistors via said polycrystalline silicon film and wirings via diffusing into respecitve portions of said polycrystalline silicon film impurities therein.

20. A semiconductor device according to claim 19, wherein said MISFET, resistors and wirings comprise memory cells of a SRAM.

21. A semiconductor integrated circuit device having memory cells each of which including first and second inverters each comprising a series circuit of a MISFET and a load element, output terminals of said first and second inverters being respectively connected to input terminals of said second and first inverters, said MISFETs of said second and first inverters having gate electrodes made of double-layer film comprising a first film of polycrystalline silicon into which is diffused an impurity for lowering its resistance and a second film of a silicide formed as compound silicon and a refractory metal, said load elements of said first and second inverters being made of polycrystalline silicon and being respectively formed over gate electrodes of said MISFETs with a stopper layer and an insulator layer intervening therebetween, said stopper layer being provided on the upper side of said second film and being disposed over and having the same pattern shape as said second film so as to inhibit the impurity contained in said first and second films of said MISFETs from being diffused into said load elements of said first and second inverters.

22. A semiconductor integrated circuit device according to claim 21, wherein said polycrystalline silicon of said load elements has substantially no impurity introduced therein.

23. A semiconductor intergrated circuit device according to claim 22, wherein said load elements are polycrystalline silicon film resistors.

24. A semiconductor integrated circuit device according to claim 23, wherein said load elements and the source regions of the memory cell MISFETs are connectible to respective voltage sources by wirings formed by a polycrystalline silicon film diffused with an impurity therein and provided on the upper side of said insulator layer which is over said stopper layer.

* * * * *